United States Patent
Simon et al.

(10) Patent No.: US 10,187,987 B1
(45) Date of Patent: Jan. 22, 2019

(54) INTERCONNECT ASSEMBLY WITH FLEXIBLE CIRCUIT

(71) Applicant: Rockwell Collins, Inc., Cedar Rapids, IA (US)

(72) Inventors: Bret W. Simon, West Liberty, IA (US); Russell C. Tawney, Cedar Rapids, IA (US)

(73) Assignee: ROCKWELL COLLINS, INC., Cedar Rapids, IA (US)

(*) Notice: Subject to any disclaimer, the term of this patent is extended or adjusted under 35 U.S.C. 154(b) by 25 days.

(21) Appl. No.: 15/684,614

(22) Filed: Aug. 23, 2017

(51) Int. Cl.
*H05K 1/11* (2006.01)
*H05K 3/36* (2006.01)
*H05K 1/18* (2006.01)

(52) U.S. Cl.
CPC ............. *H05K 1/118* (2013.01); *H05K 1/186* (2013.01); *H05K 3/361* (2013.01)

(58) Field of Classification Search
CPC ......... H05K 1/118; H05K 1/186; H05K 3/361
See application file for complete search history.

(56) References Cited

U.S. PATENT DOCUMENTS

| | | | | |
|---|---|---|---|---|
| 5,926,369 A | * | 7/1999 | Ingraham | H01L 23/367 165/185 |
| 6,841,855 B2 | * | 1/2005 | Jaeck | H01L 23/5385 257/668 |
| 7,358,444 B2 | * | 4/2008 | Nickerson | H01L 23/5387 174/254 |
| 2006/0192277 A1 | * | 8/2006 | RaghuRam | H01L 23/49816 257/686 |

* cited by examiner

*Primary Examiner* — Jeremy C Norris
(74) *Attorney, Agent, or Firm* — Donna P. Suchy; Daniel M. Barbieri (57) ABSTRACT

An interconnect assembly includes a spacer assembly including a top surface and a bottom surface; and a flexible circuit member including a first surface and a second surface opposite the first surface. The flexible circuit member curves about at least a portion of the spacer assembly such that a first portion of the first surface of the flexible circuit member is coupled to the top surface of the spacer assembly and a second portion of the first surface of the flexible circuit member is coupled to the bottom surface of the spacer assembly. The interconnect assembly further includes at least one top electrical interface element coupled to a first portion of the second surface of the flexible circuit member; and at least one bottom electrical interface element coupled to a second portion of the second surface of the flexible circuit member. The first portion of the second surface of the flexible circuit member is spaced apart from the second portion of the second surface of the flexible circuit member. The at least one top electrical interface element, the flexible circuit member, and the at least one bottom electrical interface element form an electrical signal path between the at least one top electrical interface element and the at least one bottom electrical interface element.

16 Claims, 7 Drawing Sheets

INTERCONNECT ASSEMBLY WITH FLEXIBLE CIRCUIT

BACKGROUND

The present disclosure is directed to an interconnect assembly with a flexible circuit. In many applications, interconnect assemblies are used as part of electronics assemblies to operatively connect a first electronics component, such as a motherboard, to a second electronics component, such as a daughter card. As component densities of electronics assemblies increase, spatial management of electronics components becomes more important.

SUMMARY

In one aspect, embodiments of the inventive concepts disclosed herein are directed to an interconnect assembly. The interconnect assembly includes a spacer assembly including a top surface and a bottom surface; a flexible circuit member including a first surface and a second surface opposite the first surface, wherein the flexible circuit member curves about at least a portion of the spacer assembly such that a first portion of the first surface of the flexible circuit member is coupled to the top surface of the spacer assembly and a second portion of the first surface of the flexible circuit member is coupled to the bottom surface of the spacer assembly; at least one top electrical interface element coupled to a first portion of the second surface of the flexible circuit member; and at least one bottom electrical interface element coupled to a second portion of the second surface of the flexible circuit member, wherein the first portion of the second surface of the flexible circuit member is spaced apart from the second portion of the second surface of the flexible circuit member. The at least one top electrical interface element, the flexible circuit member, and the at least one bottom electrical interface element form an electrical signal path between the at least one top electrical interface element and the at least one bottom electrical interface element.

In a further aspect, embodiments of the inventive concepts disclosed herein are directed to a method of forming an interconnect assembly. The method includes providing a flexible circuit member including a first surface and a second surface opposite the first surface; coupling a top electrical interface element to a first portion of the second surface of the flexible circuit member; coupling a bottom electrical interface element to a second portion of the second surface of the flexible circuit member; coupling a bottom surface of a spacer assembly to the first surface of the flexible surface element; and coupling a top surface of the spacer assembly to the first surface of the flexible circuit assembly. The top electrical interface element, the flexible circuit member, and the bottom electrical interface element form an electrical signal path between the top electrical interface element and the bottom electrical interface element.

In a further aspect, embodiments of the inventive concepts disclosed herein are directed to an interconnect assembly, including a spacer assembly including a top surface and a bottom surface; a flexible circuit extending about the spacer assembly such that a first portion of the first surface of the flexible circuit member is coupled to the top surface of the spacer assembly and a second portion of the first surface of the flexible circuit assembly is coupled to the bottom surface of the spacer assembly; a plurality of top electrical interface elements coupled to a second surface of the flexible circuit member opposite the first portion of the first surface of the flexible circuit member; and a plurality of bottom electrical interface elements coupled the second surface of the flexible circuit member opposite the second portion of the first surface of the flexible circuit member. The plurality of top electrical interface elements, the flexible circuit member, and the plurality of bottom electrical interface elements form a plurality of electrical signal paths between the plurality of top electrical interface elements and the plurality of bottom electrical interface element.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function.

DETAILED DESCRIPTION

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

Unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination or sub-combination of two or more such features, along with any other features which may not necessarily be expressly described or inherently present in the instant disclosure.

Broadly, embodiments of the inventive concepts disclosed herein are directed to an interconnect assembly. The inventive concepts disclosed herein can be used in any type of environment, including aircraft avionics components, non-aircraft vehicle components, non-vehicle components, etc. While certain examples and embodiments of the inventive concepts disclosed herein may be described with respect to a particular application, it will be appreciated that other applications may use and benefit from the inventive concepts disclosed herein.

Referring to the figures generally, embodiments of the inventive concepts disclosed herein relate to an interconnect assembly usable in an electronics assembly. For example, an electronics assembly may include a number of printed circuit boards (PCBs) that mechanically support and electrically interconnect various electronics components (e.g., active components such as diodes, transistors; passive components such as resistors, capacitors) using conductive tracks, pads, or other features on a non-conductive substrate. Component selection in part dictates the spatial restrictions relating to the electronics assembly, including required standoff distances between adjacent PCBs (e.g., PCBs overlapping on top of one another). The surfaces of the PCBs typically define interconnect or interface patterns (e.g., by way of a number of conductive pads, solder balls) that provide for electrical connectivity with other devices, including other PCBs. Adjacent PCBs within an electronics assembly may have identical interconnect patterns (e.g., a 1:1 correspondence), or alternatively may have differing interconnect patterns (e.g., differing in number, size, or pattern of interconnect elements). Conventional interconnect devices are often limited by requiring a direct 1:1 correspondence between assemblies and do not provide flexibility in terms of aspect ratio (height versus pitch) an/or the interface patterns between components.

As such, various embodiments of the inventive concepts disclosed herein are directed to an interconnect assembly (e.g., a direct surface mount (SMT) connector) usable to, for example, interconnect adjacent (e.g., spatially overlapping) PCBs. The interconnect assembly in some embodiments includes a flexible circuit member extending about (e.g., flexed or curved about) top and bottom surfaces of a spacer assembly, with solder balls or other electrical interface elements attached to the outward facing surface of the flexible circuit member adjacent the top and bottom surfaces of the spacer assembly. In this way, the height of the interconnect assembly defines the standoff distance between the PCBs. The electrical interface elements on the top and bottom of the interconnect assembly can have identical or different interconnect patterns, and may be offset laterally from one another, thereby accommodating a wide range of PCB or other component configurations and providing numerous customization options for the user. For example, a stand-off height may be varied independently from an interface pattern (e.g., pitch), different top and bottom interface patterns may be utilized, or other characteristics of the interconnect assembly may be varied to provide a desired design configuration and to facilitate, among other things, size reduction, increase of functional density, cost reduction, or enhanced thermal and/or electrical performance. Further, accommodating non-matching interconnect patterns may mitigate component obsolescence as new interconnect patterns are introduced into electronics assemblies.

Figure 1:
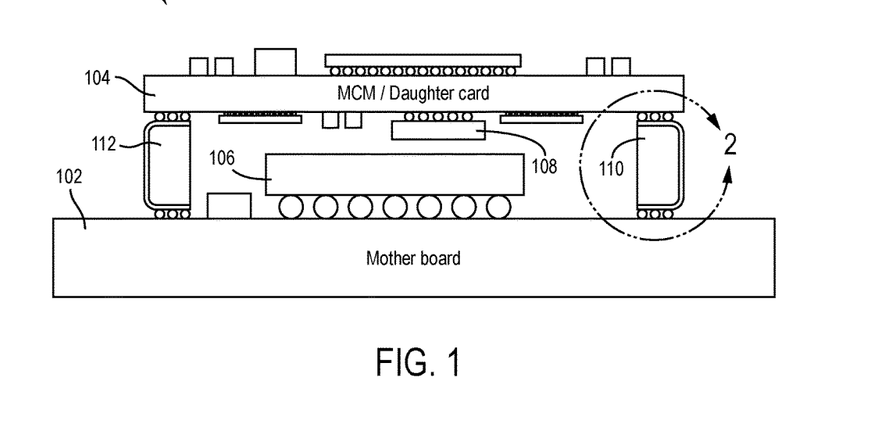
FIG. 1 is an exemplary embodiment of an electronics assembly according to the inventive concepts disclosed herein.

Referring now to FIG. 1, a schematic representation of an electronics assembly 100 is shown according to one embodiment of the inventive concepts disclosed herein. The electronics assembly 100 includes a first electronics component 102, a second electronics component 104, additional components 106, 108, and interconnect assemblies 110, 112. In some embodiments of the inventive concepts disclosed herein, the first electronics component 102 is a first PCB (e.g., a mother board), and the second electronics component 104 is a second PCB (e.g., a daughter card) positioned in an overlapping orientation relative to the first electronics component 102. The additional components 106, 108 are mounted on the first electronics component 102 and the second electronics component 104. The interconnect assemblies 110, 112 operatively (e.g., mechanically and electrically) interconnect the first electronics component 102 with the second electronics component 104. The interconnect assemblies 110, 112 may be identical or different in configuration (e.g., having the same or different top and bottom interconnect patterns). The interconnect assembly 110 will be discussed in greater detail below.

Figure 2:
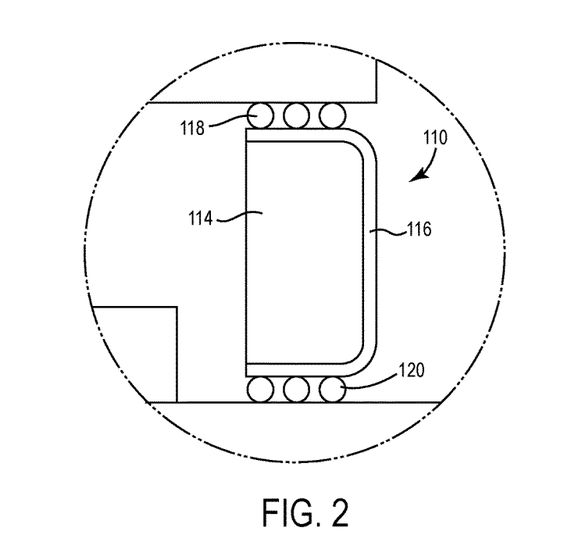
FIG. 2 is an exemplary embodiment of an interconnect assembly of the electronics assembly of FIG. 1 according to the inventive concepts disclosed herein.

Referring now to FIG. 2, the interconnect assembly 110 is shown according to the inventive concepts disclosed herein. The interconnect assembly 110 includes a spacer assembly 114, flexible circuit member 116, one or more top electrical interface elements 118, and one or more bottom electrical interface elements 120. The flexible circuit member 116 is coupled to the spacer assembly 114. The top electrical interface elements 118 and the bottom electrical interface elements 120 are coupled to the flexible circuit member 116. The top electrical interface elements 118 and the bottom electrical interface elements 120 extend in generally opposite directions relative to the spacer assembly 114 for attachment to adjacent electronics components (e.g., PCBs).

The top electrical interface elements 118, the flexible circuit member 116, and the bottom electrical interface elements 120 form an electrical signal path between the top electrical interface elements 118 and the bottom electrical interface elements 120.

Figure 3:
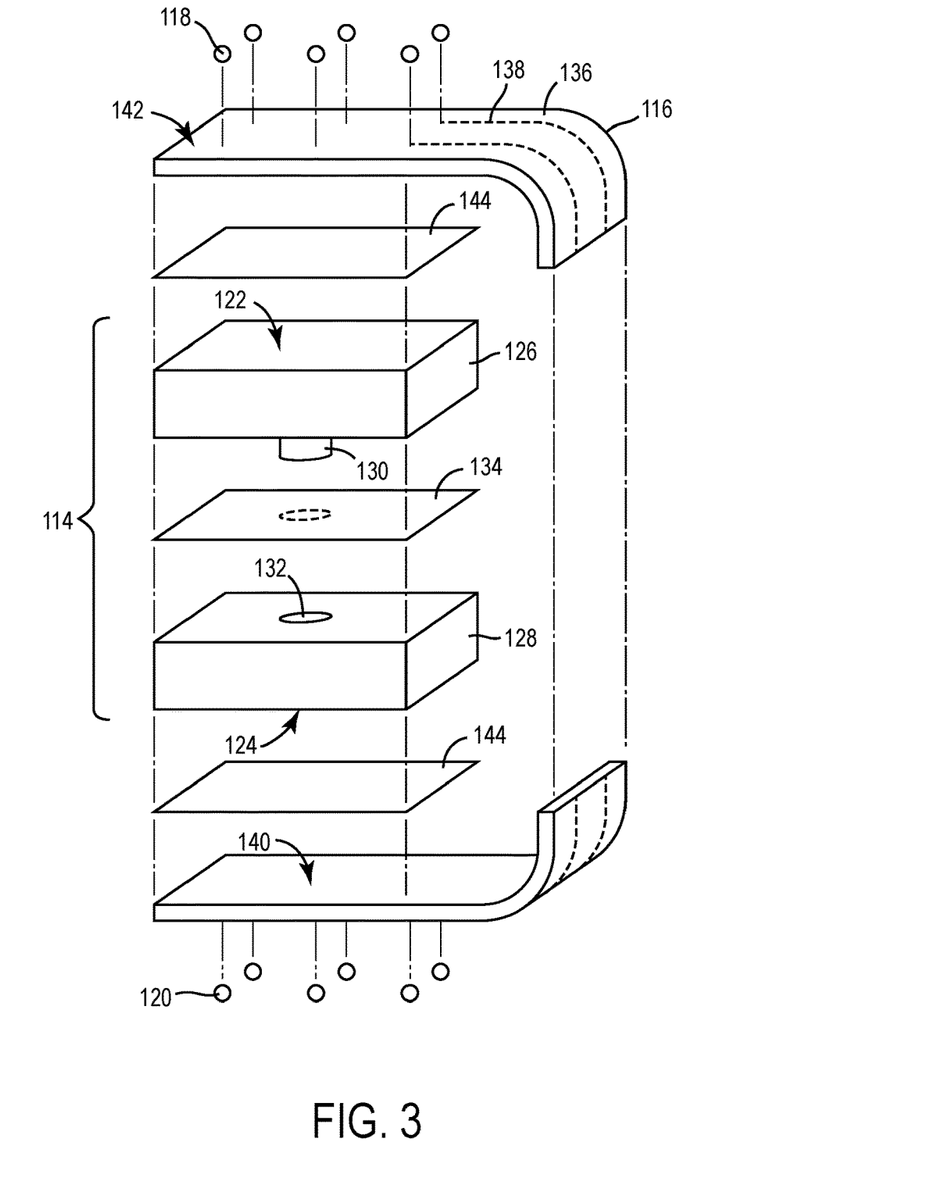
FIG. 3 is an exemplary embodiment of an exploded view of an interconnect assembly according to the inventive concepts disclosed herein.

Referring to FIG. 3, in some embodiments of the inventive concepts disclosed herein, the spacer assembly 114 defines a top surface 122 and a bottom surface 124, and is a multi-part assembly and includes a first, or top spacer 126, and a second, or bottom spacer 128. The first spacer 126 and the second spacer 128 are coupled together to form the spacer assembly 114. In one embodiment, the first spacer 126 includes a projection 130 and the second spacer 128 includes a recess 132 configured to receive the projection 130 and properly align the top spacer 126 and the bottom spacer 128. A layer of adhesive 134 may be positioned between the top spacer 126 and the bottom spacer 128 to ensure a secure fit between the top spacer 126 and the bottom spacer 128. In other embodiments, the relative positions of the projection 130 and the recess 132 may be reversed, such that the first spacer 126 includes the recess 132 and the second spacer 128 includes the projection 130. Further, more than one projection and more than one recess may be utilized to provide for multiple interface positions between the first spacer 126 and the second spacer 128. In some embodiments of the inventive concepts disclosed herein, the projection 130 and recess 132 are configured to positively lock the top spacer 126 and the bottom 128 spacer together (e.g., by way of a snap-fit), while in other embodiments, the projection 130 and the recess 132 serve primarily an alignment purpose and do not positively lock the top spacer 126 and the bottom spacer 128 together (e.g., in the case of a friction or sliding fit).

In various alternative embodiments of the inventive concepts disclosed herein, the spacer assembly 114 may be a single piece component (e.g., integrally formed), a multi-piece component (e.g., including two or more components bonded or otherwise coupled together), be rigid, semi-rigid, or flexible, and take any suitable size and shape. All such variations are to be understood to be within the scope of the present disclosure.

Referring further to FIG. 3, the flexible circuit member 116 may include a flexible substrate 136 (e.g., a plastic substrate) onto which circuit paths 138 are printed or otherwise provided (e.g., using a photolithographic process, or laminating conductive circuit strips between layers or substrate). The flexible circuit member 116 may be a single layer or multi-layer assembly. The flexible circuit member 116 is flexible such that, for example, the flexible circuit member 116 can curve about a portion of the spacer assembly 114 and enable mounting of the top electrical interface elements 118 and the bottom electrical interface elements 120. As shown in FIG. 3, a first surface 140 of the flexible circuit member is coupled to both the top surface 122 and the bottom surface 124 of the spacer assembly 114. One or more layers of adhesive 144 may be used to bond a first portion of the first surface 140 of the flexible circuit member 116 to the top surface 122 of the spacer assembly 114 and bond a second portion of the first surface 140 of the flexible circuit member 116 to the bottom surface 124 of the spacer assembly 114. Other methods of coupling the flexible circuit member 116 to the spacer assembly 114 may be used according to various other embodiments of the inventive concepts disclosed herein.

The flexible circuit member 116 defines a second surface 142 opposite the first surface 140 that faces away from the spacer assembly 114. The top electrical interface elements 118 are bonded to a first portion of the second surface 142 of the flexible circuit member 116 and the bottom electrical interface elements 120 are bonded to a second portion of the second surface 142 of the flexible circuit member 116. The top and bottom electrical interface elements 118, 120 may form any appropriate interface pattern for mating with adjacent electronics components, such as the first electronics component 102 and the second electronics component 104 shown in FIG. 1 as part of the electronics assembly 100. The top electrical interface elements 118 and the bottom electrical interface elements 120 may form identical interface patterns or different interface patterns (e.g., to accommodate different mating interface patterns).

In one embodiment of the inventive concepts disclosed herein, the top and bottom electrical interface elements 118, 120 are solder spheres and are soldered to the flexible circuit member 116. In other embodiments, other components may be used, including but not limited to, solder studs, solder pads, plated studs (e.g., for compatibility with solder-free contacts), an anisotropic conductive film (e.g., for direct mounting), or combinations thereof. The top electrical interface elements 118 and the bottom electrical interface elements 120 may be the same as or differ in type, size, shape, or other characteristics to suit a particular application.

Figure 4A:
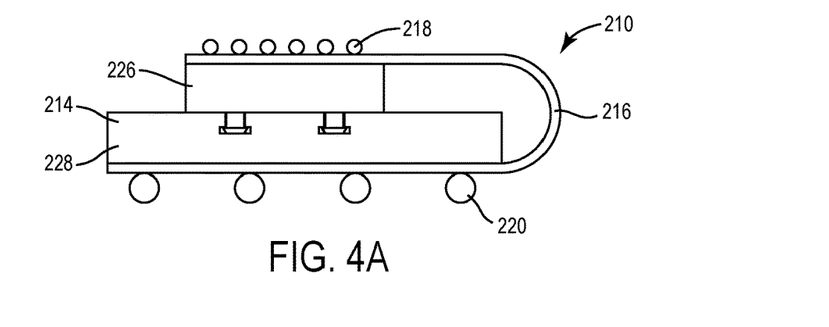
FIGS. 4A-4E are exemplary embodiments of an interconnect assembly at differing stages of assembly according to the inventive concepts disclosed herein.

Referring now to FIGS. 4A-4E, an interconnect assembly 210 is shown according to the inventive concepts disclosed herein. The interconnect assembly 210 is generally similar to the interconnect assembly 110 except as discussed herein. The interconnect assembly 210 includes a spacer assembly 214, a flexible circuit member 216, top electrical interface elements 218, and bottom electrical interface elements 220. As shown in FIG. 4A, the top electrical interface elements 218 form a first interface pattern and the bottom electrical interface elements 220 form a second interface pattern different from the first interface pattern. Further, the bottom electrical interface elements 220 are of a different size (e.g., different diameter spheres) and positioned at a different spacing from the top electrical interface elements 218.

The spacer assembly 214 includes a first spacer 226 and a second spacer 228. As shown in FIG. 4A, the first spacer 226 is smaller than the second spacer 228 and defines a smaller surface area in contact with the flexible circuit member 216. The sizes of the first and second spacers 226, 228 may be varied to accommodate differences in the sizes of the interface patterns between the top electrical interface elements 218 and the bottom electrical interface elements 220.

Figure 4B:
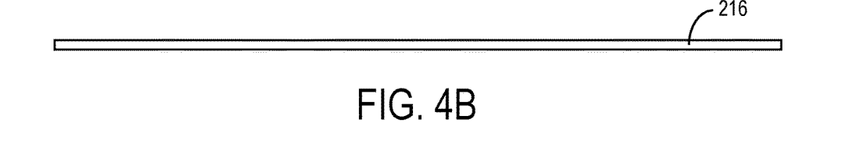
Figure 4C:
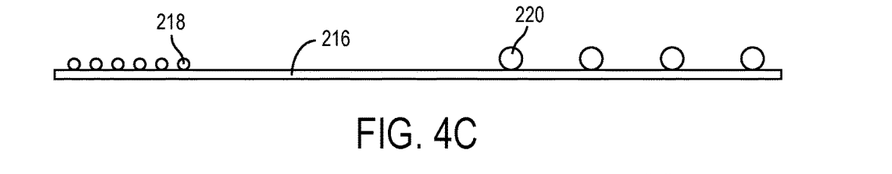
Figure 4D:
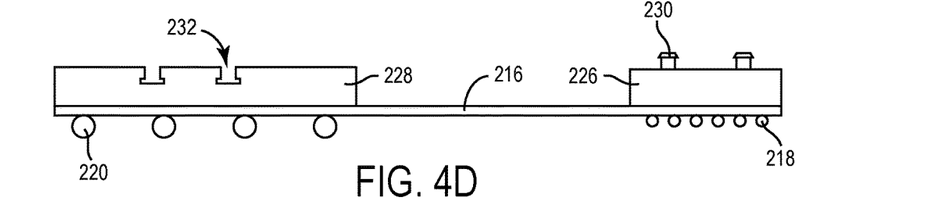
Figure 4E:
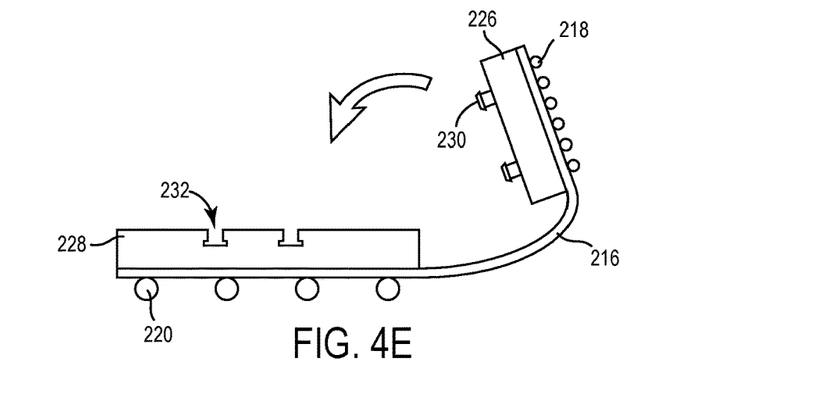

Referring to FIGS. 4B-4E, the interconnect assembly 210 is shown at various stages of assembly. FIG. 4B shows the flexible circuit member 216 prior to having any further components attached. FIG. 4C shows the top electrical interface elements 218 attached to a first portion of a second surface of the flexible circuit member 216 and the bottom electrical interface elements 220 attached to a second portion of the second surface of the flexible circuit member 216. FIG. 4D shows the first spacer 226 attached to a first portion of the first surface of the flexible circuit member 216 and the second spacer 228 attached to a second portion of the first surface of the flexible circuit member 216. FIG. 4E shows the flexible circuit member 216 partially flexed as the first spacer 226 is moved into engagement with the second spacer 228. Referring back to FIG. 4A, the interconnect assembly 210 is fully assembled, with the projections 230 on the first spacer 226 engaged with the recesses 232 on the second spacer 228. As with the interconnect assembly 110 shown in FIGS. 2-3, various adhesive layers may be utilized in connection with the interconnect assembly 210 shown in FIGS. 4A-4E to bond the various components together.

The interconnect assembly 210 shown in FIG. 4A may be customized to suit a particular application. For example, the mating interface for the top electrical interface elements 218 may not be directly above the mating interface for the bottom electrical interface elements 220. As such, all or a portion of the top electrical interface elements 218 may be offset laterally (e.g., in a direction perpendicular to a height direction of the interconnect assembly 210) from the bottom electrical interface elements 220. The peripheral shapes of the first spacer 226 and the second spacer 228 may differ and be varied accordingly to support correspondingly-sized interface patterns formed by the top electrical interface elements 218 and the bottom electrical interface elements 220.

Figure 5A:
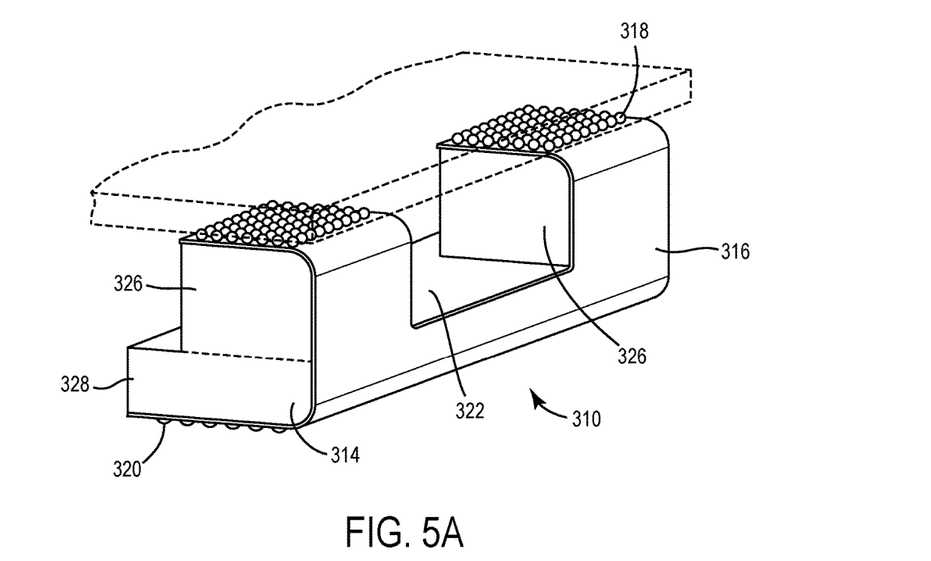
FIGS. 5A and 5B show an exemplary embodiment of an interconnect assembly according to the inventive concepts disclosed herein.
Figure 5B:
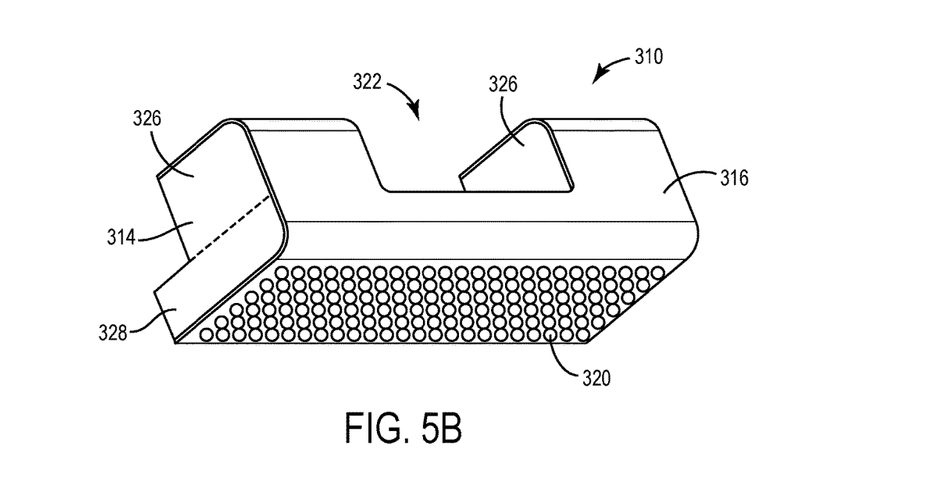

Referring now to FIGS. 5A-5B, an alternative embodiment of an interconnect assembly 310 is shown according to the inventive concepts disclosed herein. The interconnect assembly 310 may be similar to the interconnect assemblies 110, 210 shown in FIGS. 2-3 and FIGS. 4A-4E except as noted herein. The interconnect assembly 310 includes a spacer assembly 314, a flexible circuit member 316, top electrical interface elements 318, and bottom electrical interface elements 320. The interconnect assembly 310 includes a cut-out area 322 to accommodate additional electronics components such as the additional components shown in FIG. 1. As shown in FIG. 5A, the top electrical interface elements 318 form two separate interface patterns, and the flexible circuit member 316 and the spacer assembly 314 collectively define the cutout area 322 between the two separate interface patterns. As shown in FIG. 5B, the bottom electrical interface elements 320 form a continuous interface pattern. In some embodiments of the inventive concepts disclosed herein, the spacer assembly 314 is formed by three separate spacers, with one bottom or second spacer 328 underlying the bottom electrical interface elements 320 and a top or first spacer 326 underlying each of the two separate groups of top electrical interface elements 318. As such, the collective top surface area formed by the spacer assembly 314 is less than the surface area of the bottom surface of the spacer assembly 314. The cutout area 322 shown in FIGS. 5A-5B may take any suitable shape or be any suitable size. Further, multiple cutouts may be provided in a single interconnect assembly to accommodate space constraints or other application-specific requirements.

Figure 6A:
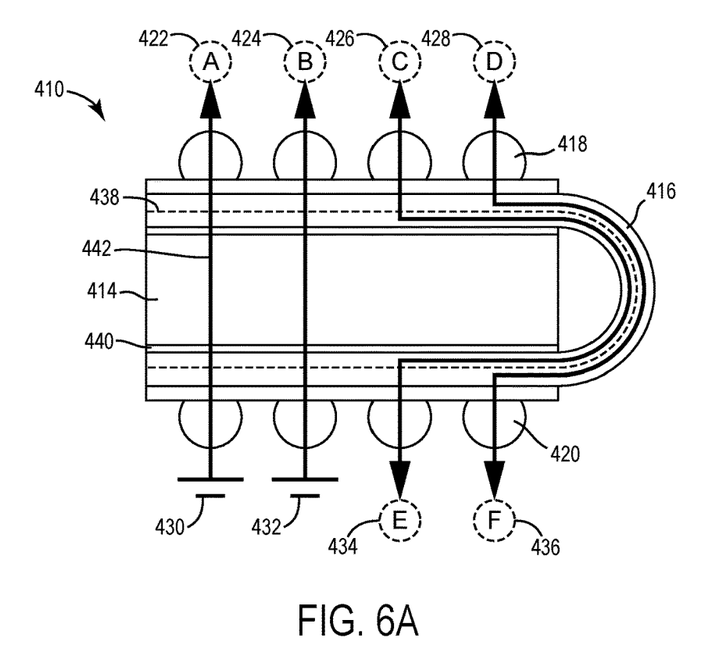
FIGS. 6A-6B are exemplary embodiments of interconnect assemblies according to the inventive concepts disclosed herein.
Figure 6B:
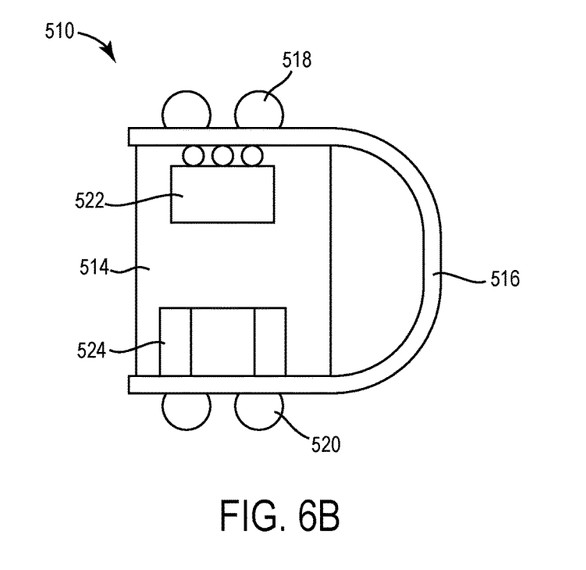

Referring now to FIGS. 6A-6B, alternative interconnect assemblies are shown according to the inventive concepts disclosed herein. The interconnect assemblies shown in FIGS. 6A and 6B may share all or some of the features of the other interconnect assemblies disclosed herein. Referring to FIG. 6A, an interconnect assembly 410 is shown usable to connect various first connection points 422, 424, 426, 428 to various second connection points 430, 432, 434, 436. The interconnect assembly 410 includes a spacer assembly 414, a flexible circuit member 416, top electrical interface elements 418, and bottom electrical interface elements 420. The flexible circuit member 416 may provide a generally 1:1 correspondence between connection points, such that the first connection points 422, 424, 426, 428 are mapped to the second connection points 430, 432, 434, 436 in the same pattern. For example, with a 1:1 correspondence, point A 422 would be connected to ground 430, point B 424 would be connected to ground 432, point C 426 would be connected to point E 434, and point D 428 would be connected to point F 436. In alternative embodiments, the interconnect assembly 410 provides a non-1:1 mapping, such that the interconnect patterns differ. For example, point A 422 may be connected to point E 434, point B 424 may be connected to point F 436, and the like. Any appropriate mapping between connection points may be used to suit a particular application (e.g., to redistribute an input/output pattern). The flexible circuit member 416 may include one or more layers 438 that are conductive (e.g., to provide shielding to one or more electrical components coupled to the flexible circuit member 416). The flexible circuit member 416 may be bonded to the spacer assembly 414 by way of a bonding layer 440. The bonding layer 440 may be an adhesive layer, and may provide an electrically and/or thermally conductive bond line.

Referring further to FIG. 6A, in some embodiments, the spacer assembly 414 may be thermally and/or electrically conductive. For example, in one embodiment, the spacer assembly 414 is thermally conductive and formed of a thermally conductive material (e.g., metal) to enhance the thermal performance of the interconnect assembly 410. In alternative embodiments, the spacer assembly 414 may alternatively or further be electrically conductive and made of an electrically conductive material to provide for electrical conduction through the spacer assembly 414 (e.g., for high current connections, ground connections). To provide specific electrical and/or thermal conductivity properties, the spacer assembly 414 may be made of a mixture of materials (e.g., differing metals on a top portion and a bottom portion of the spacer assembly). Further, one or more vias 442 may be formed in the spacer assembly 414 and extend between the top and bottom surfaces of the spacer assembly 414.

Referring to FIG. 6B, in some embodiments, an interconnect assembly 510 includes a flexible circuit member 516, a spacer assembly 514, a plurality of top electrical interface elements 518, a plurality of bottom electrical interface elements 520, and one or more additional, embedded components 522, 524. The embedded components 522, 524 may in some embodiments be embedded within the spacer assembly 514, and electrically coupled to an opposite side of the flexible circuit member 516 from the top and bottom electrical interface elements 518, 520.

Figure 7:
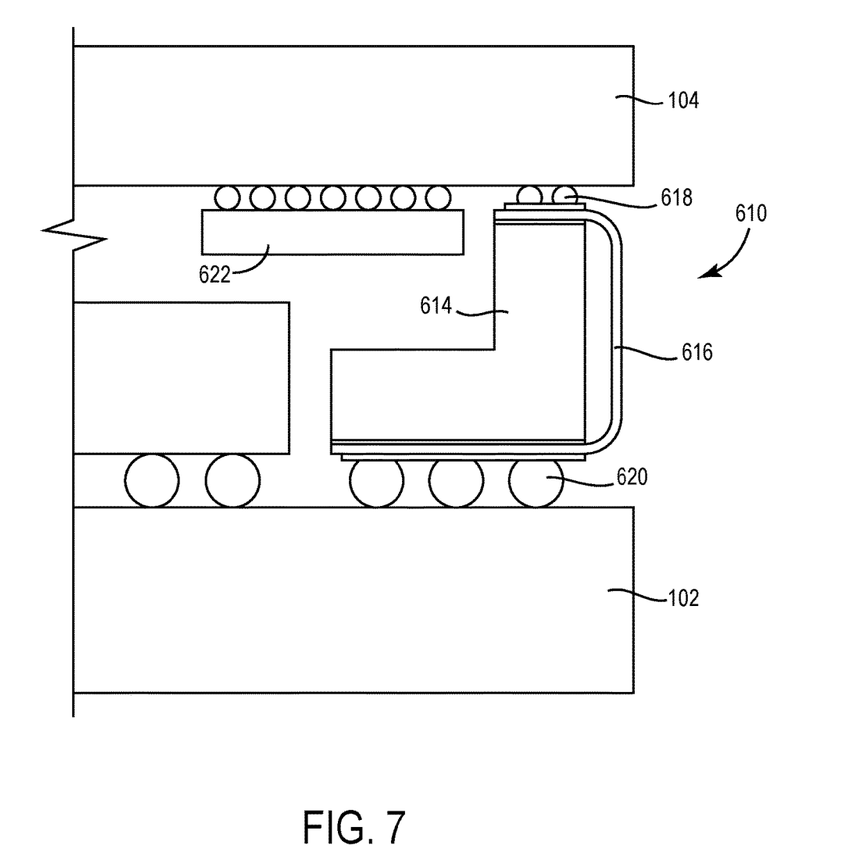
FIG. 7 is an exemplary embodiment of an electronics assembly according to the inventive concepts disclosed herein.

Referring to FIG. 7, an interconnect assembly 610 is shown according to the inventive concepts disclosed herein. Interconnect assembly 610 may share some or all of the features of the other interconnect assemblies disclosed herein. The interconnect assembly 610 includes a spacer assembly 614, a flexible circuit member 616, a plurality of top electrical interface elements 618, and a plurality of bottom electrical interface elements 620. As shown in FIG. 7, the spacer assembly 614 may have a non-uniform size along a height, and an interface pattern defined by the top electrical interface elements 618 may be different from an interface pattern defined by the bottom electrical interface elements 620. Further, the top electrical interface elements 618 may have a different size (e.g., be smaller) than the bottom electrical interface elements 620. This may provide advantages over more conventional interposers or other components that use through-vias with little or no ability to redistribute the input/output interface patterns. Further, utilizing an interconnect assembly such as the interconnect assembly 610 shown in FIG. 7 may allow placement of additional components such as the additional component 622 shown attached to the second electronics component 104 of FIG. 7. It should be understood that the particular shape of the spacer assembly 614 and the interconnect assembly 610 are not to be construed as limiting, but are an example of how the size, shape, interface patterns, and other features of an interconnect assembly may be customized according to the inventive concepts disclosed herein.

Figure 8:
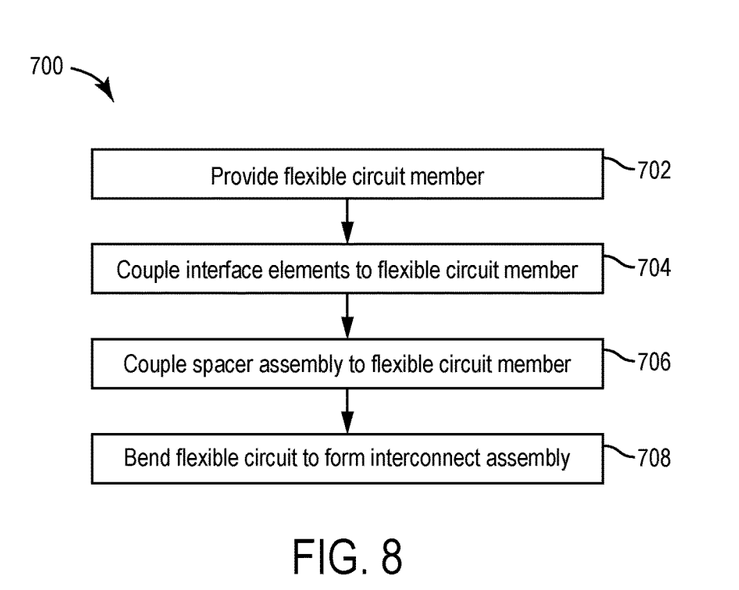
FIG. 8 is an exemplary embodiment of a method of making an interconnect assembly according to the inventive concepts disclosed herein.

Referring now to FIG. 8, a method 700 of making an interconnect assembly is shown according to the inventive concepts disclosed herein. First, a flexible circuit member is provided (702). The flexible circuit member may be any suitable flexible circuit member, including any of the flexible circuit members disclosed herein (see, e.g., FIG. 4B). Electrical interface elements are coupled to a second surface of the flexible circuit member (704) (see, e.g., FIG. 4C). As discussed in detail herein, the electrical interface elements may form a top interface pattern and a bottom interface pattern for the interconnect assembly, and the top and bottom interface patterns may be the same or different to suit a particular application. A spacer assembly is coupled to a first surface of the flexible circuit member (706) (see, e.g., FIG. 4D). The spacer assembly may be provided in the form of a single piece or multiple pieces, and may be bonded to the flexible circuit member using any suitable process or method, including adhesives and mechanical joining techniques. The flexible circuit member is bent or flexed to extend about the spacer assembly and form the interconnect assembly (708) (see, e.g., FIG. 4E). In some embodiments of the inventive concepts disclosed herein, forming the interconnect assembly further includes coupling a first spacer to a second spacer to form the spacer assembly (e.g., via adhesive bonding, mechanical interface(s), combinations thereof). In some alternative embodiments of the inventive concepts disclosed herein, one or both sides of the interconnect assembly may be direct-bonded to an electronics components such as a PCB (e.g., by hot bar soldering or use of an anisotropic film).

Figure 9:
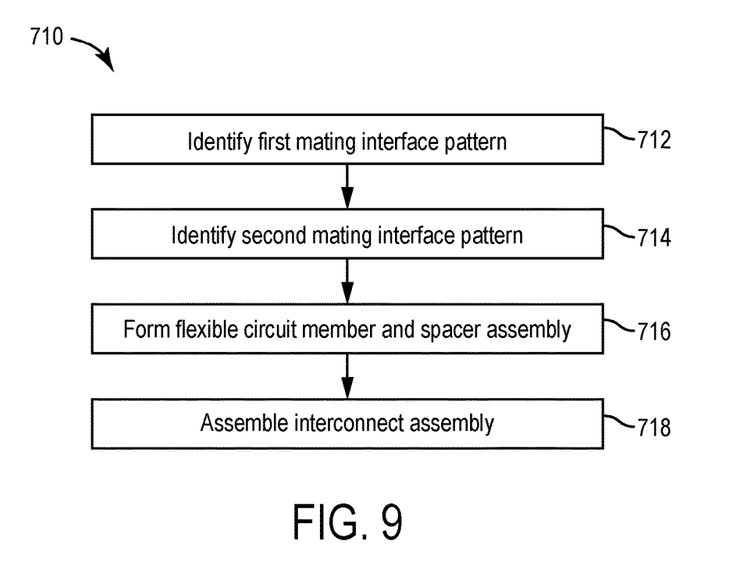
FIG. 9 is an exemplary embodiment of a method of making an interconnect assembly according to the inventive concepts disclosed herein.

Referring now to FIG. 9, an alternative method 710 of making an interconnect assembly is shown according to the inventive concepts disclosed herein. A first mating interface pattern is identified or determined (712). The first mating interface pattern may be, for example, a mating interface pattern to which the top of the interconnect assembly will electrically couple, such that the top electrical interface elements of the interconnect assembly have a pattern matching that of the first mating interface pattern. A second mating interface pattern is identified or determined (714). The second mating interface pattern may be, for example, a mating interface pattern to which the bottom of the interconnect assembly will electrically couple, such that the bottom electrical interface elements of the interconnect assembly have a pattern matching that of the second mating interface pattern. As part of identifying the first and second mating interface patterns, the relative positions of the mating interface elements are determined (e.g., (x,y,z) positional coordinates of each interface pattern). Based on the first and second mating interfacing patterns and corresponding positional information, a flexible circuit member and spacer assembly are formed or produced (716). Utilizing the flexible circuit member and spacer assembly, an interconnect assembly is assembled (718), including top and bottom electrical interface elements configured to interface with the first and second mating interface patterns.

It should be noted that while certain geometries of components are shown in the drawings for purposes of illustration, various alternative geometries for components of the assemblies disclosed herein may be utilized according to various alternative embodiments of the inventive concepts disclosed herein. Similarly, while certain components may be shown as generally aligned, parallel, or otherwise spatially related, in various alternative embodiments, the relative positions and orientations of the components may be varied to suit a particular application.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried out in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed is:

1. An interconnect assembly, comprising:
    a spacer assembly including a top surface and a bottom surface, wherein the spacer assembly includes a first spacer including the top surface of the spacer assembly and a second spacer including the bottom surface of the spacer assembly and coupled to the first spacer, wherein one of the first spacer and the second spacer includes a projection, and wherein the other of the first spacer and the second spacer includes a recess configured to receive the projection when the first spacer is coupled to the second spacer;
    a flexible circuit member including a first surface and a second surface opposite the first surface, wherein the flexible circuit member curves about at least a portion of the spacer assembly such that a first portion of the first surface of the flexible circuit member is coupled to the top surface of the spacer assembly and a second portion of the first surface of the flexible circuit member is coupled to the bottom surface of the spacer assembly;
    at least one top electrical interface element coupled to a first portion of the second surface of the flexible circuit member; and
    at least one bottom electrical interface element coupled to a second portion of the second surface of the flexible circuit member, wherein the first portion of the second surface of the flexible circuit member is spaced apart from the second portion of the second surface of the flexible circuit member;
    wherein the at least one top electrical interface element, the flexible circuit member, and the at least one bottom electrical interface element form an electrical signal path between the at least one top electrical interface element and the at least one bottom electrical interface.

2. The assembly of claim 1, wherein the spacer assembly defines a height extending along a first axis between the top surface and the bottom surface, and wherein the at least one top electrical interface element is offset from the at least one bottom electrical interface element in a direction perpendicular to the first axis.

3. The assembly of claim 2, wherein the first portion of the second surface of the flexible circuit member is offset from the second portion of the second surface of the flexible circuit member in a direction perpendicular to the first axis.

4. The assembly of claim 1, wherein the at least one top electrical interface element includes a plurality of top electrical interface elements defining a top interface pattern, and wherein the at least one bottom electrical interface element includes a plurality of bottom electrical interface elements defining a bottom interface pattern.

5. The assembly of claim 4, wherein the top interface pattern is different from the bottom interface pattern.

6. The assembly of claim 1, wherein the spacer assembly includes at least one of a thermally conductive spacer and an electrically conductive spacer.

7. The assembly of claim 1, wherein the spacer assembly includes at least one cutout portion such that a surface area of the top surface of the spacer assembly is different from a surface area of the bottom surface of the spacer assembly.

8. A method of forming an interconnect assembly, comprising:
providing a flexible circuit member including a first surface and a second surface opposite the first surface;
coupling a top electrical interface element to a first portion of the second surface of the flexible circuit member;
coupling a bottom electrical interface element to a second portion of the second surface of the flexible circuit member;
coupling a second spacer to the first surface of the flexible surface element;
coupling a first spacer to the first surface of the flexible circuit assembly;
flexing the flexible circuit member and coupling the first spacer to the second spacer; and
wherein the top electrical interface element, the flexible circuit member, and the bottom electrical interface element form an electrical signal path between the top electrical interface element and the bottom electrical interface element.

9. The method of claim 8, wherein one of the first spacer and the second spacer includes a projection, and wherein the other of the first spacer and the second spacer includes a recess configured to receive the projection when the first spacer is coupled to the second spacer.

10. The method of claim 8, wherein the top electrical interface element includes a plurality of top electrical interface elements defining a top interface pattern, and wherein the bottom electrical interface element includes a plurality of bottom electrical interface elements defining a bottom interface pattern.

11. The method of claim 8, wherein the flexible circuit member includes an electrically conductive portion configured to provide shielding to at least one electrical component coupled to the flexible circuit member.

12. The method of claim 8, wherein the first spacer includes at least one cutout portion such that a surface area of a top surface of the first spacer is different from a surface area of a bottom surface of the second spacer assembly.

13. An interconnect assembly, comprising:
a spacer assembly including a top surface and a bottom surface;
a flexible circuit extending about the spacer assembly such that a first portion of the first surface of the flexible circuit member is coupled to the top surface of the spacer assembly and a second portion of the first surface of the flexible circuit assembly is coupled to the bottom surface of the spacer assembly;
a plurality of top electrical interface elements coupled to a second surface of the flexible circuit member opposite the first portion of the first surface of the flexible circuit member; and
a plurality of bottom electrical interface elements coupled the second surface of the flexible circuit member opposite the second portion of the first surface of the flexible circuit member;
wherein the plurality of top electrical interface elements, the flexible circuit member, and the plurality of bottom electrical interface elements form a plurality of electrical signal paths between the plurality of top electrical interface elements and the plurality of bottom electrical interface element; and
wherein the spacer assembly includes a first spacer including the top surface of the spacer assembly and a second spacer including the bottom surface of the spacer assembly and coupled to the first spacer.

14. The assembly of claim 13, wherein the plurality of top interface elements define a top interface pattern, and wherein the plurality of bottom interface elements defining a bottom interface pattern different from the top interface pattern.

15. The assembly of claim 13, wherein the spacer assembly includes at least one of a thermally conductive spacer and an electrically conductive spacer.

16. The assembly of claim 13, wherein the spacer assembly includes at least one cutout portion such that the top surface of the spacer assembly is different from the bottom surface of the spacer assembly in at least one of a surface area and a peripheral shape.

\* \* \* \* \*